(12) United States Patent
Sarin et al.

(10) Patent No.: US 8,737,127 B2
(45) Date of Patent: May 27, 2014

(54) MEMORY CONTROLLERS TO OUTPUT DATA SIGNALS OF A NUMBER OF BITS AND TO RECEIVE DATA SIGNALS OF A DIFFERENT NUMBER OF BITS

(71) Applicant: Micron Technology, Inc., Boise, ID (US)

(72) Inventors: Vishal Sarin, Saratoga, CA (US); Jung-Sheng Hoei, Fremont, CA (US); Jonathan Pabustan, San Lorenzo, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/770,059

(22) Filed: Feb. 19, 2013

(65) Prior Publication Data

US 2013/0166815 A1    Jun. 27, 2013

Related U.S. Application Data

(60) Division of application No. 12/948,952, filed on Nov. 18, 2010, now Pat. No. 8,385,121, which is a continuation of application No. 12/137,171, filed on Jun. 11, 2008, now Pat. No. 7,843,725.

(51) Int. Cl.
*G11C 16/04*    (2006.01)

(52) U.S. Cl.
USPC ............ 365/185.03; 365/185.11; 365/185.21; 365/185.24

(58) Field of Classification Search
USPC .............. 365/185.03, 185.11, 185.21, 185.24
See application file for complete search history.

(56) References Cited

U.S. PATENT DOCUMENTS

| | | | |
|---|---|---|---|
| 5,530,955 A | 6/1996 | Kaneko | |
| 7,120,052 B2 | 10/2006 | Shibata et al. | |
| 7,221,592 B2 | 5/2007 | Nazarian | |
| 7,327,616 B2 | 2/2008 | Kameda et al. | |
| 7,372,715 B2 | 5/2008 | Han | |
| 7,400,532 B2 | 7/2008 | Aritome | |
| 7,474,560 B2 | 1/2009 | Aritome | |
| 7,480,177 B2 | 1/2009 | Lee et al. | |
| 7,623,384 B2 | 11/2009 | Iwata | |
| 7,633,798 B2 * | 12/2009 | Sarin et al. | 365/185.03 |
| 7,843,725 B2 * | 11/2010 | Sarin et al. | 365/185.03 |
| 8,259,497 B2 * | 9/2012 | Shalvi et al. | 365/185.09 |
| 8,369,141 B2 * | 2/2013 | Sommer et al. | 365/185.03 |
| 8,385,121 B2 * | 2/2013 | Sarin et al. | 365/185.12 |
| 8,400,858 B2 * | 3/2013 | Meir et al. | 365/207 |
| 2007/0047310 A1 | 3/2007 | Roohparvar et al. | |
| 2009/0129153 A1 | 5/2009 | Sarin et al. | |

* cited by examiner

*Primary Examiner* — Pho M Luu
(74) *Attorney, Agent, or Firm* — Dicke, Billig & Czaja, PLLC

(57) ABSTRACT

A memory controller has a digital signal processor. The digital signal processor is configured to output a digital data signal of M+N bits of program data intended for programming a memory cell of a memory device. The digital signal processor is configured to receive a digital data signal of M+L bits read from the memory cell of the memory device and to retrieve from the received digital data signal M bits of data that were stored in the memory cell.

16 Claims, 13 Drawing Sheets

MEMORY CONTROLLERS TO OUTPUT DATA SIGNALS OF A NUMBER OF BITS AND TO RECEIVE DATA SIGNALS OF A DIFFERENT NUMBER OF BITS

RELATED APPLICATION

This application is a divisional of U.S. patent application Ser. No. 12/948,952, titled "MEMORY ADAPTED TO PROGRAM A NUMBER OF BITS TO A MEMORY CELL AND READ A DIFFERENT NUMBER OF BITS FROM THE MEMORY CELL," filed Nov. 18, 2010, issued as U.S. Pat. No. 8,385,121 on Feb. 26, 2013, which is a continuation of U.S. patent application Ser. No. 12/137,171, titled "M+L BIT READ COLUMN ARCHITECTURE FOR M BIT MEMORY CELLS," filed Jun. 11, 2008, issued as U.S. Pat. No. 7,843,725 on Nov. 30, 2010, each of which is commonly assigned and incorporated herein by reference.

TECHNICAL FIELD

The present disclosure relates generally to semiconductor memory, and in particular, the present disclosure relates to solid state non-volatile memory devices and systems utilizing analog signals to communicate data values of two or more bits of information.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
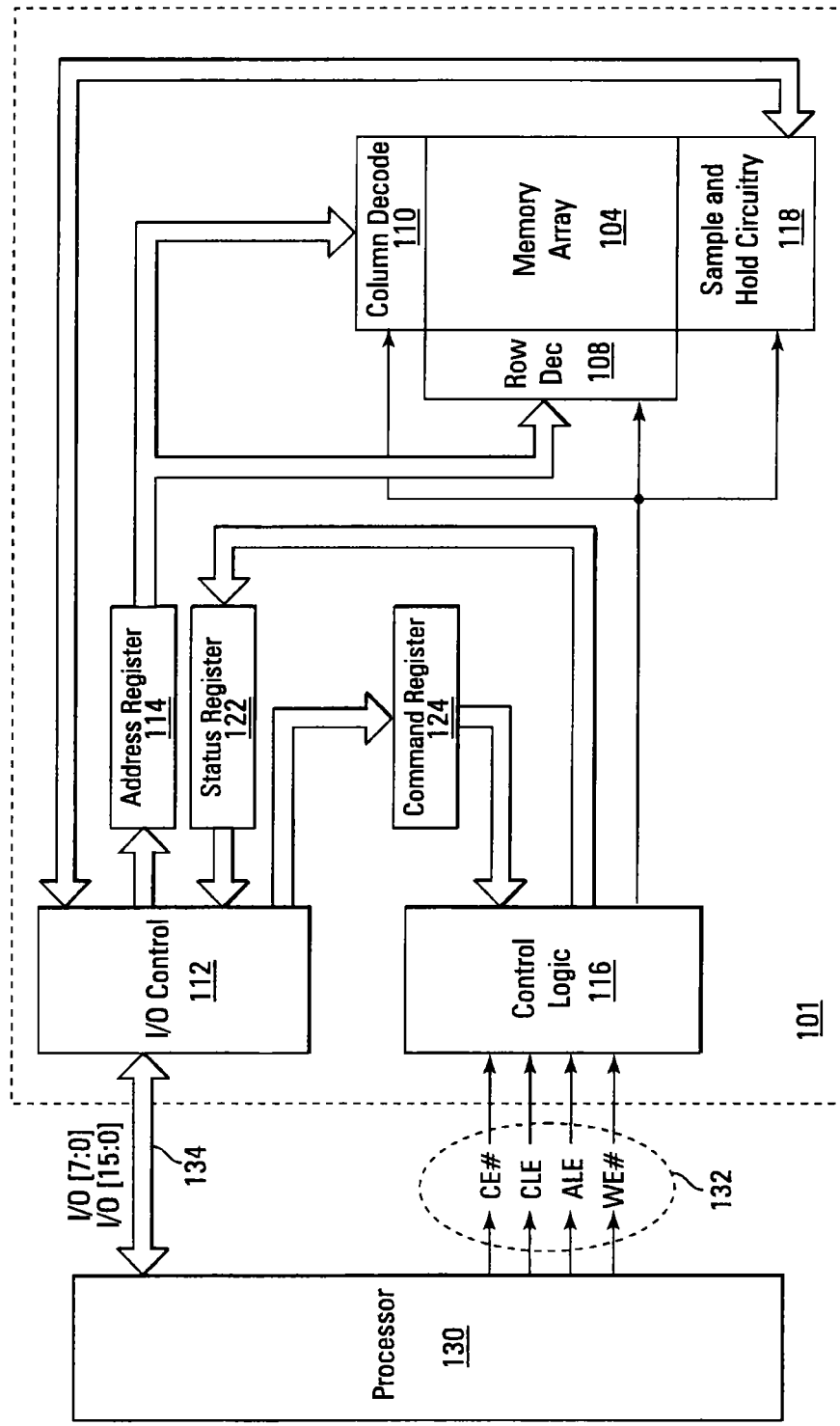
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values or bit patterns. Typically, a dead space or margin of 0.2V to 0.4V is between each range to keep the Vt distributions from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
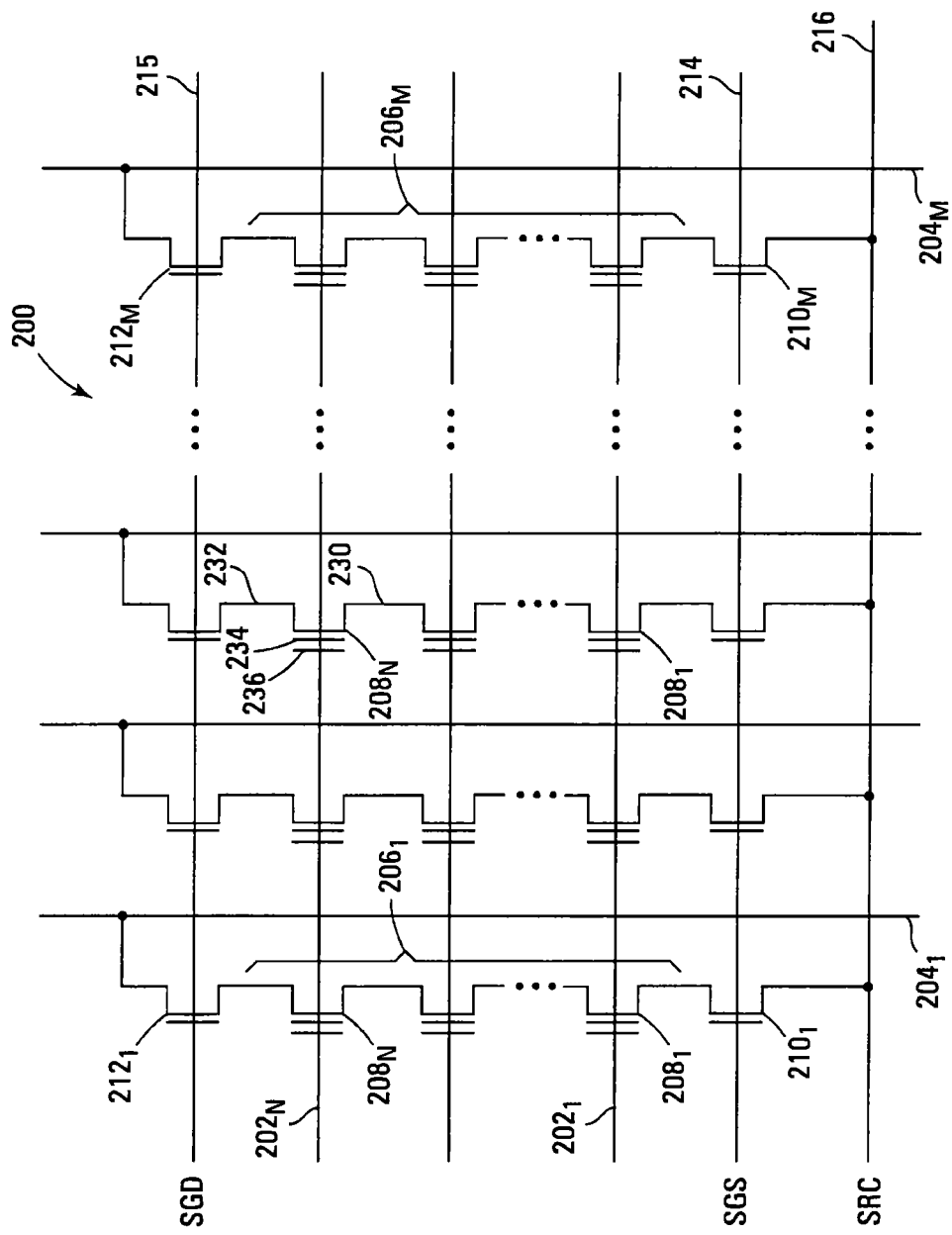
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
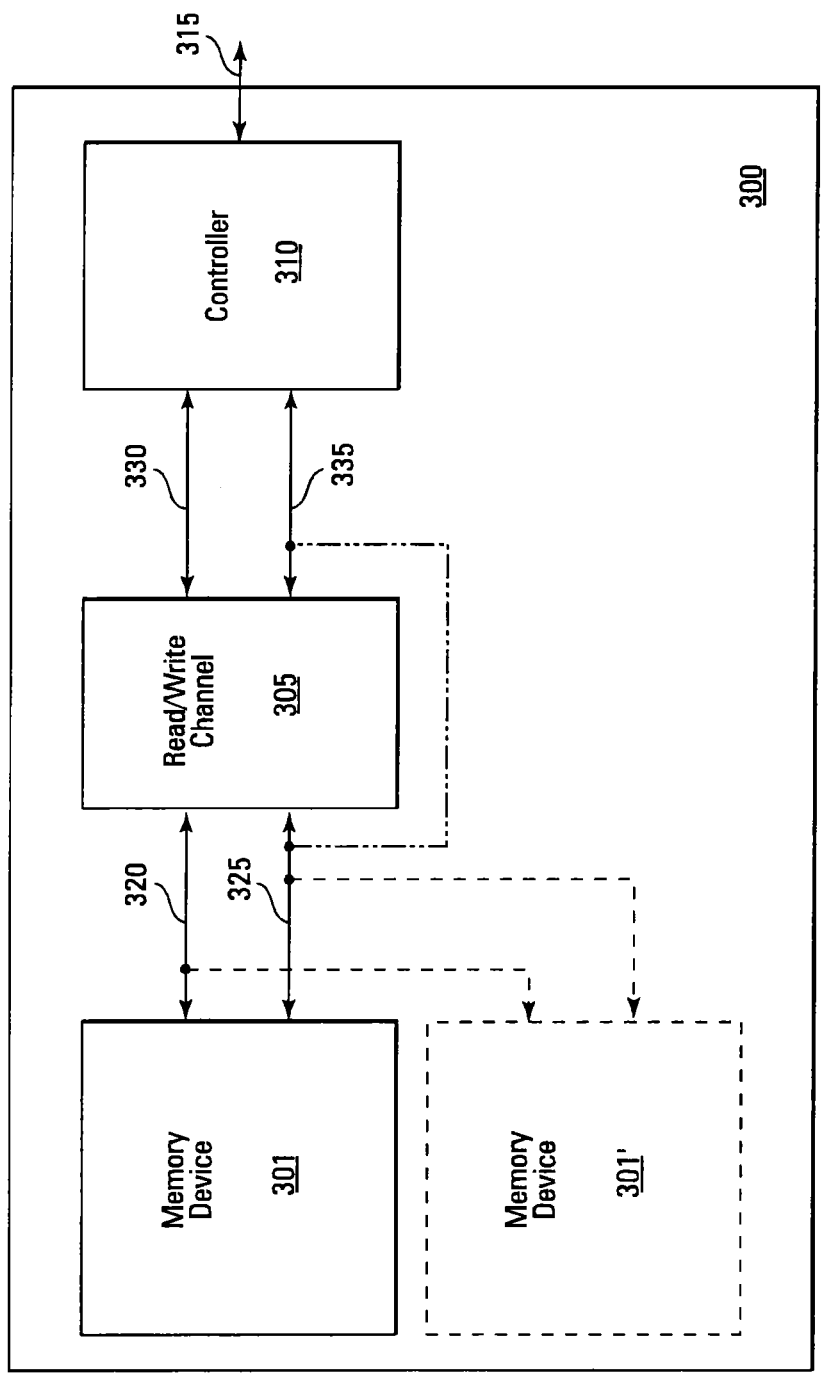
FIG. 3 is a block schematic of a solid state bulk storage device in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
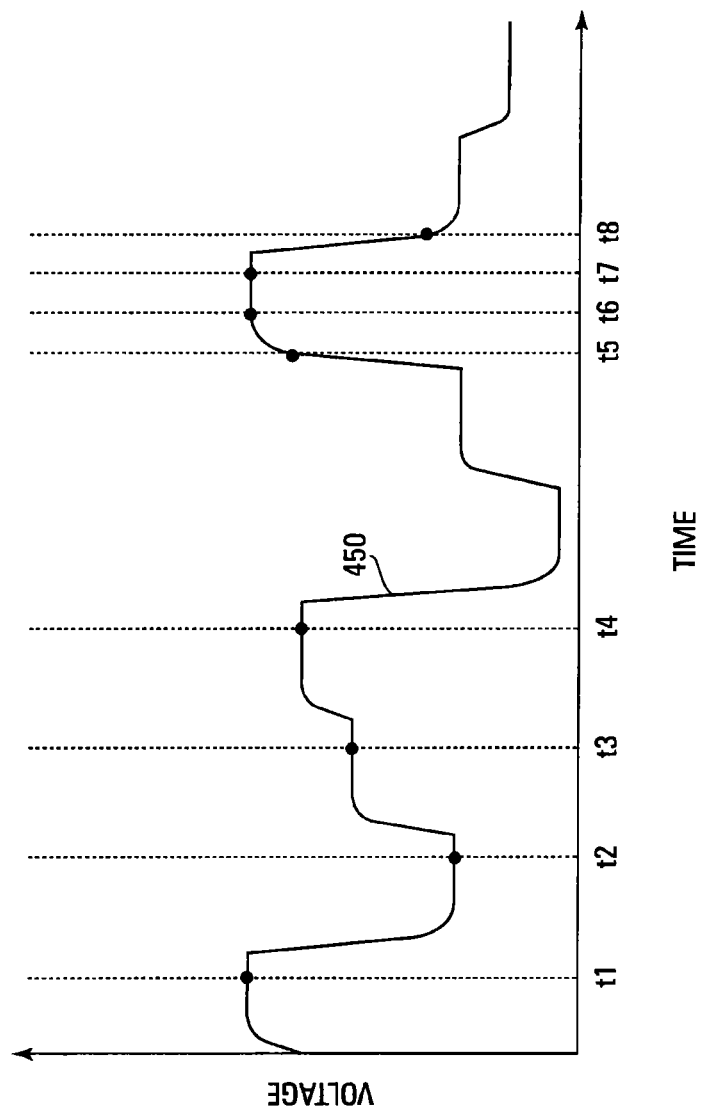
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
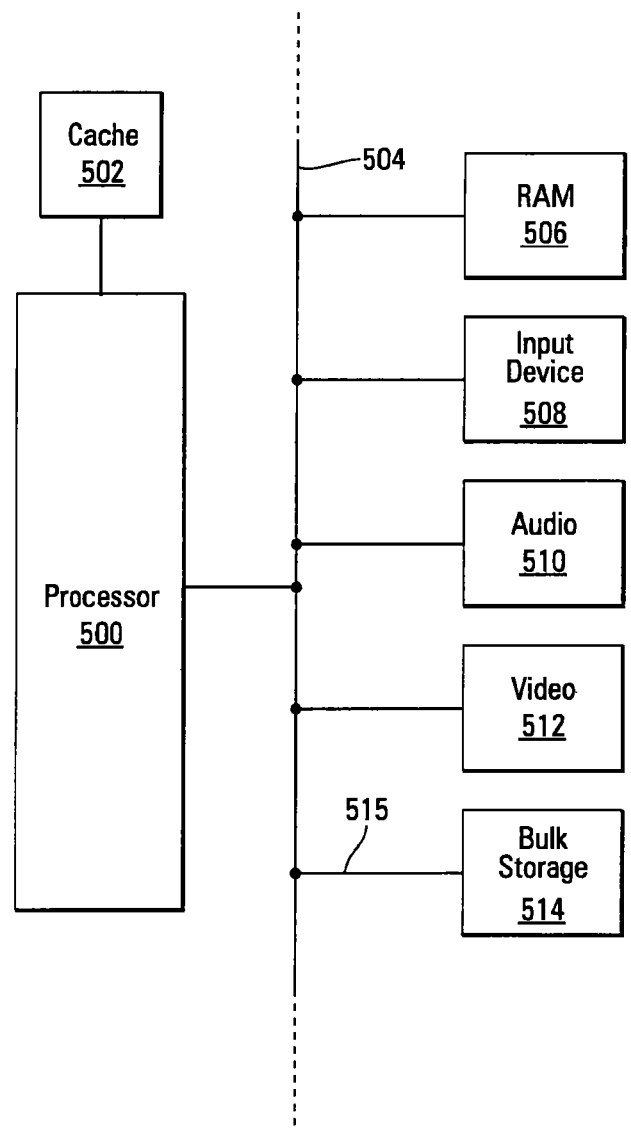
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

M+L Bit Read Column Architecture for M Bit Memory Cells

Threshold voltages of non-volatile memory cells in memories, including those in multi-level cells and systems such as those described above, are typically assigned in ranges (which are also known as "logic windows", windows, Vt distributions, threshold voltage levels, or threshold states) to indicate stored states, such as those representing a stored data value. As stated above, typically, a buffer of dead space (also known herein as margin, dead space, buffer, buffer margin, buffer areas, or buffer zones) is placed between each range to keep the Vt distribution ranges from overlapping. These ranges are typically referred to in operation of the memory by the data value it represents and/or the nominal threshold voltage level assigned to the range. For example, as detailed in FIG. 6A, an exemplary two bit-per-cell (i.e., M=2 for $2^M$ states in the cell) MLC memory has four logic window ranges of 200 mV defined in each cell to represent the 11, 01, 10 and 00 states with a 200 mV to 400 mV buffer between the ranges. In this exemplary memory, the 10 logic state is assigned to the 0.8V to 1.0V range and has a nominal threshold voltage level of 0.9V. The nominal threshold voltage for a given Vt logic window state is typically utilized as the target voltage level to be gained in programming the memory cell to that logic state (yet is typically not achieved exactly due to cell variations and programming over/undershoot). In reading or otherwise sensing a non-volatile memory cell (e.g., as part of a read or verify operation), the sensed threshold voltage of the memory cell is matched to one of the threshold voltage ranges (and the corresponding nominal threshold voltage/logic state) to allow the state of the memory cell to be interpreted as digital data and then manipulated or transferred from the memory device.

Many factors limit the effective number of states modern non-volatile memories can reliably store and retrieve, such as the limited threshold voltage range achievable in non-volatile memory devices and non-volatile memory cell processes, the likelihood of programmed threshold voltage inaccuracy and programming/read disturb for the memory cell (generally related to memory cell characteristics, including feature size and process), and the requirement for placing a separating buffer between logic window ranges (that may also vary in size due to memory cell programming inaccuracy, Vt disturb and cell characteristics). Because of this only a limited number of threshold voltage ranges can be defined in a given cell and still be reliably programmed and read, regardless of whether the memory and related circuits may be able to program and read at a higher voltage resolution. This limited number of "logic windows" for a given memory device, cell, and process technology is typically further restricted by the practice of storing binary values in each cell, thereby further limiting the number of usable logic windows to the closest power of two (2, 4, 8, 16, 32, or 64 logic windows to represent 1, 2, 4, 5, or 6 bits, respectively, in each cell) below the physical window limit.

Figures 6A, 6B:
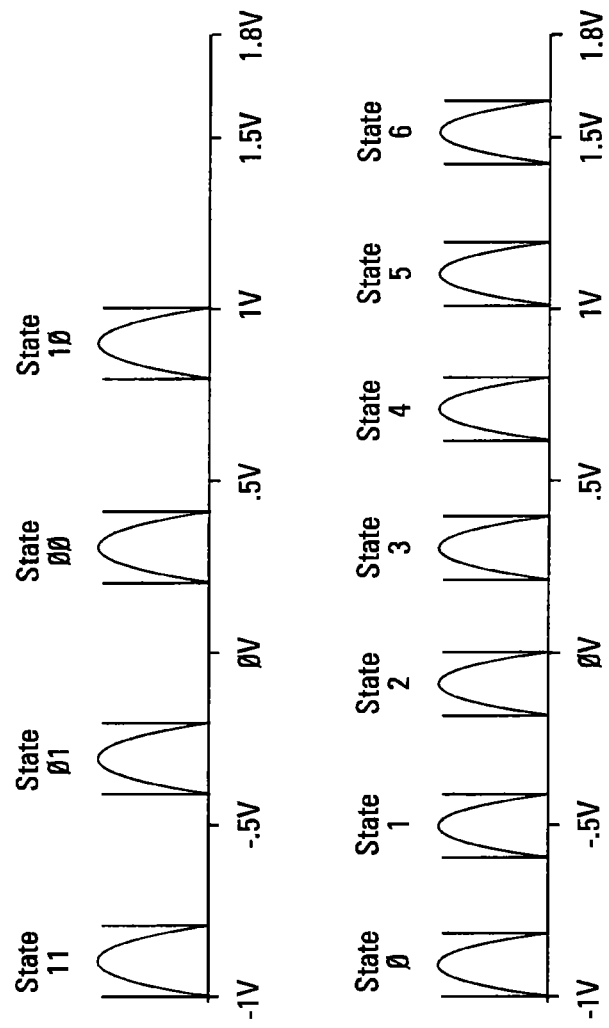
FIGS. 6A-6B detail diagrams detailing threshold voltage logic window states of non-volatile memory cells in accordance with embodiments of the present invention.

For example, in FIG. 6A, in a memory cell having a useable threshold voltage range of −1.0V to 1.8V, four states are defined ($2^2$ states, storing 2 bits in each cell), each having a range of 200 mV with a 400 mV buffer between adjacent ranges. State 11 (erased) is defined to be from −1V to −0.8V, State 01 from −0.4V to −0.2V, State 00 from 0.2V to 0.4V, and State 10 from: 0.8V to 1.0V. However, as the memory cells of the array have a usable threshold voltage range of −1.0V to 1.8V with a minimum usable logic window range of 200 mV and a minimum buffer between ranges of 200 mV, a resolution of up to seven states is possible, as detailed in FIG. 6B (States 0 to 6—State 0: −1V to −0.8V, State 1: −0.6V to −0.4V, State 2: −0.2V to 0V, State 3: 0.2V to 0.4V, State 4: 0.6V to 0.8V, State 5: 1.0V to 1.2V, and State 6: 1.4V to 1.6V.

One or more embodiments of the present invention program a selected row of non-volatile multi-level memory cells (MLC) comprising multiple pages of cells in a single, substantially simultaneous operation to minimize program disturb and increase the overall programming speed of the row. Meanwhile, each page of memory cells of the row is verified separately, such as to allow use of data line (e.g., bit line) shielding and increased latching resources for increased resolution reads. In one embodiment of the present invention, the memory device utilizes storage elements, such as data latches, to program M-bits of data (or M+N bits of data, where the N bits are additional "soft" bits of data included to allow for the compensation and/or pre-adjustment of the final threshold voltage being selected and targeted in the cell) into each cell of the selected row in a M-bit per cell MLC memory and then repurposes the data latches during the subsequent sequential page verify operations of the row to allow the reading of M+L bits from each cell of each page at a higher threshold voltage resolution than required. In sensing memory cells, the increased threshold voltage resolution, which is sometimes also referred to as granularity, allows more accurate interpretations of the actual programmed state of the memory cell and also enables more effective use of data encoding and decoding techniques such as convolutional codes where additional granularity of information is used to make soft decisions reducing the overall error rate of the memory. The architecture enables other decoding techniques such as PRML, Trellis Code Modulation and other advanced codes such as LDPC and Turbo codes which utilize probabilistic decoding techniques to achieve optimal decoding, thereby reducing the overall error rate of the memory. It is noted that, while the embodiments are described in relation to NAND architecture non-volatile memory arrays and devices utilizing digital and analog communication, it will be apparent to those skilled in the art that the concepts disclosed herein are applicable to other non-volatile memory array architectures and corresponding memory devices, including, but not limited to NOR arrays, AND arrays, OR arrays, and virtual ground arrays.

In programming and sensing (e.g., reading) a non-volatile memory cell, one or more embodiments of the present invention divide the usable threshold voltage range of the non-volatile memory cells into an increased number of ranges, yielding a programming and/or a sense voltage resolution (also known as programming and/or sensing granularity) for the memory device that is higher than required by the defined logic windows of the cell. It is noted that in some embodiments of the present invention this increased programming and/or sense voltage resolution may be higher than the maximum number of logic windows/threshold voltage ranges the memory cells can reliably store. It is also noted that programming operation resolution can differ from that of sense operation resolution. In one embodiment the programming operation voltage resolution is lower than the read operation sense voltage resolution, allowing for increased read accuracy and data read back/encoding. In another embodiment of the present invention the programming operation voltage resolution is higher than the read operation sense voltage resolution, allowing for increased programming accuracy and data disturb compensation, thereby increasing data storage stability and subsequent read back accuracy.

The programmed threshold voltage of memory cells in memories, including those in multi-level cells and systems as described above, can deteriorate in various ways and for various reasons. Program disturb is one of these many causes for threshold voltage deterioration. Program disturb happens when the programming of subsequent memory cells affect the programmed threshold voltage of a previously programmed memory cell. In some cases, particularly in modern memory cells with reduced feature sizes and smaller ranges and buffer margins, program disturb can move the programmed threshold voltage of the cell to the extent such that it causes an error when read (such as when the cell threshold voltage is moved to be within the buffer between logic window ranges) or causes the cell to read as being in a different state altogether than that originally programmed.

One such method of predicting and compensating for program disturb of memory cells in NAND architecture non-volatile memory devices and arrays is detailed in U.S. patent application Ser. No. 12/136,546 (now U.S. Pat. No. 7,746,691), titled "METHODS AND APPARATUS UTILIZING PREDICTED COUPLING EFFECT IN THE PROGRAMMING OF NON-VOLATILE MEMORY," filed Jun. 10, 2008, which is commonly assigned.

Program disturb is generally caused by capacitive coupling between adjacent cells and by large programming voltages applied to the adjacent (and inhibited) non-volatile memory cells that are coupled to common access lines (e.g., word lines), source lines, data lines (e.g., bit lines) and substrate connections, as the selected memory cells. Generally speaking, in program disturb events subsequently-programmed memory cells will tend to pull up the threshold voltage of a prior-programmed neighboring memory cell. For example, non-volatile memory cells are typically erased, or brought to some initial threshold voltage, prior to programming to their desired threshold voltage. This initial threshold voltage is usually a negative voltage, e.g., −1V. Memory cells are then programmed in sequence to their desired threshold voltages (e.g., a target threshold voltage). Programming generally involves applying a series of programming pulses of increasing voltage to increase the charge stored on the floating gate, with each pulse generally followed by a verify operation to determine whether the memory cell has reached its desired threshold voltage. As individual memory cells reach their desired threshold voltage, they are inhibited from further programming. Upon reaching the desired threshold voltages for all memory cells of a selected page of a word line, programming is halted and the memory cells in the next page of the word line, or along a page of the next adjacent word line are then programmed. This process is repeated until memory cells along each selected page in the programming operation are programmed.

As memory cells along a subsequent word line or in the adjacent columns are programmed, their increasing threshold voltages will increase the threshold voltage of prior programmed memory cells in other word lines as well as in adjacent columns due to floating gate to floating gate coupling effect. This will result in an increase of the threshold voltage of these prior-programmed memory cells. While this threshold voltage increase is small, it can hinder the ability to store increasing numbers of bits of data per memory cell. Complicating this is that in many modern non-volatile memories each row comprises multiple "pages" of memory cells that are typically interleaved so that each cell and associated data line of a page are adjacent to cells of one or more other pages and their associated bit lines. In addition, as memory cells are used to store more and more bits of data per cell, this coupling effect is becoming more troublesome as there is less room for such Vt drift as the Vt ranges associated with each bit pattern defined state become more narrow and the margins between the Vt ranges also generally decrease. Thus, by predicting the coupling effect of subsequently-programmed memory cells, the coupling effect can be advantageously utilized to tighten the distribution of threshold voltages for a given bit pattern state by reducing unexpected Vt drift, which can facilitate more discernable Vt ranges, and thus a higher number of bits of data per memory cell, and/or wider margins between Vt ranges, and thus increased reliability in reading the correct data value of a memory cell.

In one exemplary embodiment of the present invention, the number of defined states are a binary number ($2^M$, where M is the number of bits of user data being stored in the memory cell). It is noted that a number of programming resolution threshold voltage ranges/states can also be selected to be $2^{M+N}$, where N is an extra number of programming resolution bits utilized for adjusting programming data and compensating for predicted program disturb effects. It is noted, however, that the number of extra programming states and defined programmed threshold voltage logic windows do not have to be a factor of two or represent a whole number of bits.

In read, verify or other sense operations, one or more embodiments of the present invention sense the threshold voltages of the selected memory cells at higher resolutions than required by the defined number of logic windows/threshold voltage range states, yielding a sensed threshold voltage resolution (in nominal threshold voltage ranges) for the memory device that is higher than the defined number of states of the cell. It is noted that the sensed threshold voltage ranges will typically also cross the buffer areas between the logic windows. This allows for increased sensing accuracy and proximity based error correction in situations where the threshold voltage has drifted out of the logic window. This allows the memory device to compensate for Vt drift and disturb in "near" or "guess" reads (e.g., allowing for a guess as to the correct programmed logic state of the cell that can be confirmed with a quick ECC code check, whereas before only a read error would be reported and a computationally intensive ECC error correction algorithm started to attempt to correct the error(s)). In addition, in one embodiment the increased sensing resolution enables the utilization of data encoding techniques in the programming of data that enhance data read back (increasing reliability and error compensation) when utilized in conjunction with the increased data read resolution of one or more embodiments of the present invention. These data encoding techniques can include, but are not limited to, convolutional codes where additional granularity of information is used to make soft decisions and utilize probabilistic decoding techniques to achieve optimal decoding thereby reducing the overall error rate of the memory, partial response maximum likelihood (PRML), low-density parity check (LDPC), Turbo, and Trellis modulation encoding.

During sensing operations, the usable threshold voltage range of the non-volatile memory cells being sensed is divided into a larger number of threshold voltage ranges than required by the defined number of states of the memory cell. This increased sensing resolution allows the sensed threshold voltage to be accurately read and placed in a defined threshold voltage range, enabling more reliable read and/or verify operation. Utilizing the above example from programming, the non-volatile memory cell has a usable threshold voltage range of −1V to 1.8V and stores 5 defined states, each represented by a 400 mV range, with 200 mV margins between the logic window ranges (State 0: −1V to −0.6V, State 1: −0.4V to 0V, State 2: 0.2V to 0.6V, State 3: 0.8V to 1.2V, State 4: 1.4V to 1.8V). Disturb events are predicted to move the programmed threshold voltage (Vt) of a cell +/−50 mV. As such, the programming resolution is selected to sense the threshold voltage utilizing a 25 mV or smaller resolution to allow for accurate threshold voltage read and possible error compensation/correction due to any threshold voltage drift.

In one embodiment of the present invention, the number of defined states being read are a factor of two ($2^M$, where M is the number of bits of user data stored in the memory cell), while the number of read resolution states in the memory cell are also selected to be a factor of two (utilizing $2^{M+L}$ states/voltage ranges, where L is the number of extra bits being utilized in sensing level data or read data). It is noted, however, as above that the number of extra sensing levels/resolution states and the defined number of threshold voltage logic windows also do not have to be a factor of two. It is also noted that increased read resolution and/or accuracy will generally come at the cost of a slower sensing operation due to the finer threshold voltage steps being read and increased signal settling times and that read resolution can be changed by selectively masking off the extra L bits of sensed threshold voltage data. In one embodiment of the present invention, read operations utilize a higher resolution than a corresponding programming operation, enabling an increased amount of data to be available for processing when read. Thus, in binary implementation utilizing $2^{M+N}$ programming ranges/states (or $2^M$, in the simplified case where N=0) and $2^{M+L}$ read ranges/states, L will be greater than N.

One such method of increased M+N bit programming resolution and increased M+L bit sensing resolution of memory cells in non-volatile memory devices and arrays is detailed in U.S. patent application Ser. No. 11/943,916 (now U.S. Pat. No. 7,633,798), titled "M+N BIT PROGRAMMING AND M+L BIT READ FOR M BIT MEMORY CELLS," filed Nov. 21, 2007, which is commonly assigned.

As stated above, in a non-volatile memory a program operation alters the Vt of a cell to match a state corresponding to M-bits stored in data latches of a data cache, while in a read operation sense the bit line current and match the state of the cell to a bit pattern state and store the result in the data latches.

One or more embodiments of the present invention program all the memory cell pages of a row (comprising two or more "read" pages) substantially simultaneously in a programming cycle, utilizing M-bits of data latches per cell to store the data to be programmed into the selected row. In the subsequent verify/read operations (and in reads in general) the latches of the non-volatile memory are repurposed and multiplexed together to read M+L bits from each cell of the selected page, such as to verify that the cells were properly programmed in the row, wherein L can be from zero up to maximum allowed by the number of available latches per cell in a given page, and where L can be different between verify and read operations. This column architecture enhances programming performance while providing the capability for M-bit per cell program and M+L bit per cell read with minimum size penalty compare to conventional column architecture. Thus, for example, for a two page row, a single program cycle pulse occurs to program the entire row at once with each cell programming to M-bits of MLC data, followed by two verify reads, one to each page of M-bit MLC cells in the row to read M+L bits from each. In this, the M-bits of data represent M "hard" bits of data stored in the cell, where the L-bits represent L extra "soft" bits of additional read resolution (which is sometime referred to as "over read") to be utilized by the non-volatile memory, memory controller or system for data interpretation and error correction of the sensed Vt level of each memory cell.

In prior art non-volatile memory devices having multiple pages per row, each page of a selected row is programmed and verified separately (in a two page per row example one would program and verify the memory cells coupled to the odd numbered bit lines to program the odd page, and then program and verify the even memory cells/bit lines of the even page). Because of this page sequential program and verify cycle of a programming operation, the first programmed memory cells (the memory cells of the odd page) are generally disturbed more (subjected to more disturb events) than the second programmed memory cell (the memory cells of the even page) because of the programming cycle of the second programmed bit lines. Multi-level cell non-volatile memories that oversample when sensing the non-volatile memory cells of the array during a read or a verify operation (have increased M+L bit sensing resolution) also require more latches than necessary programming the M-bits of user data they store in each MLC memory cell because of the increased resolution required for sensing the cells and latching the results (M+L bits) for use in internal memory operations or transfer from the memory.

It would be desirable to program all the bit lines that are in a row together to avoid the subsequent disturb effects on the initially programmed pages of the selected row. Since program disturb happens mainly when a first cell is programmed and then is subsequently "disturbed", such as by having it's Vt altered by the later programming of an adjacent cell, programming the whole row at once should provide an even disturb pattern for the adjacent pages within the row. A near non-disturbed state can also be attained for this whole row programming if the M-bit data values to be programmed are pre-adjusted in value and compensated for predicted disturb effects before they are programmed into the row. It is noted, however, that the cells of the row would still experience some capacitive coupling between the bit lines coupled to the cells of the row during programming due to adjacent bit lines electrically coupling to each other, but this is a more moderate effect that can be compensated for by the bit line signals being actively driven from the data latches of the data cache holding the data to be programmed.

While you can typically ignore this adjacent bit line coupling in row operations during programming cycles on a row, and therefore you can typically program all the cells on a row at the same time (in fact, it is desirable for avoidance of adjacent page program disturb), this bit line coupling is a greater effect for sensing operations (such as reads or verifies) and must be taken into account. This is because the coupling of the adjacent bit lines are such that they can corrupt the relatively low current levels of non-volatile memory cells being read. Generally speaking, a bit line is long, highly resistive and capacitive, therefore sensitive to coupling from another active bit line and the introduction of sensing errors. As such, the cells (and their associated bit lines) of the pages defined in a row are interleaved and each page of a row is generally conventionally sensed separately for each read or verify operation. While the selected page is being sensed, the bit lines of the adjacent pages (having memory cells adjacent to and between each cell of the selected page of the row) are typically grounded to allow them to act as shields for the active bit lines of the selected page to help avoid bit line coupling. In other words, when an active page is sensed, it's bit lines are shielded with the bit lines of the unselected bit lines of the row, interleaving the active and grounded bit lines. Because of this it generally requires a non-volatile memory to have as many separate sensing operations as there are pages in the row to prevent data corruption from bit line coupling and allow for signal shielding.

One or more embodiments of the present invention, this single row program cycle followed by individual page verify operations to confirm programming, allows efficient use of the data latches, repurposing them from programming M-bits of data in each cell of the unitary row program over to storing M+L bits of data sensed from each cell of a selected page during a subsequent verify or read operation, such as to allow for increase sensing resolution without an increase in the number of latches required. For example, in an embodiment with a row having two pages (odd and even), if M=4 bits of user data being stored per cell one would need 4 latches for each cell to program the 4-bits of data each in the row. One would then be able to repurpose these 4 latches per cell for the row to store up to 8 sensed bits from each cell of one of two pages of a selected row (M+L bits=4+4=8 bits resolution maximum). It is noted that the amount of increased read resolution (the L "soft" bits of addition read resolution) can be selected from zero up to the maximum allowed by the number of available latches per cell in a given page.

In one embodiment of the present invention, the bit line shielding utilized by grounding the bit lines of the unselected pages can be increased by increasing the number of pages in each row (from 2 pages per row to 3 pages, 4 pages, K pages, etc., increasing the overall number of intervening grounded bit lines of the unselected pages between the active bit lines of the selected page during sensing). Conventional column architecture utilizes one set of column read/write circuitry (e.g., sense amplifier, data latches, program control, data comparator, etc.) for every K bit lines, where K typically is 2. In other words, the bit lines of a row go through a 2:1 multiplexer and then go to one set of column read/write circuitry. It is noted that in these 1 to 3, 1 to 4, or K to 1 column bit line multiplexing situations, the number of latches available for repurposing to the active page bit lines for sensing also increases by K*M-bits because of the fact that more bit lines (of the unselected pages) are inactive and grounded, improving shielding, while effectively increasing the sensing resolution possible by freeing up more latches for repurposing. Alternatively, by increasing the number of pages defined in each row, the total number of latches required for M-bit program and increased resolution M+L bit reads on a page can be reduced (by reducing the pages size and shrinking the overall number of latches required to do an increased resolution sensing operation on the smaller page size; i.e., if the number of available latches allow for M=2 bit per cell MLC row programs, selecting the number of pages to be four, K=4, can allow enough latches for up to M+L=8 sensing resolution). Embodiments of the present invention therefore utilize a K read per one write column architecture so that read/write circuitry of the non-volatile memory are configured with a 1:1 bit line multiplexer in write mode and a K:1 bit line multiplexer in read. Therefore for every row program cycle, K separate verify operations will be performed. To program M bits (or M+N bits) of data and read M+L bits of information, it only requires M (or M+N bits) latches per bit line, no additional latches are needed as long as M>L (or, alternatively, M+N>L). One or more embodiments of the present invention can provide enhanced program performance, reduced program disturb, and increased effective program speed, while reducing the number of latches required per bit line of a given row and providing increased M+L sensing resolution.

It is noted that in alternative embodiments of the present invention, the number of defined pages in a given row can be varied to allow the read resolution to be selectably adjusted without having to increase the absolute number of latches available, such as where the number of bits (M) stored in each memory cell is adjusted up or down by the non-volatile memory or system, or to select the maximum number of latches available per cell of a page for a selected M+L sensing resolution. This can be accomplished by altering the column decoding to select more or less pages in a given row and can occur under control of the non-volatile memory device or system or be selected externally, such as by the setting of a mode register or signal line of the memory.

Figure 7:
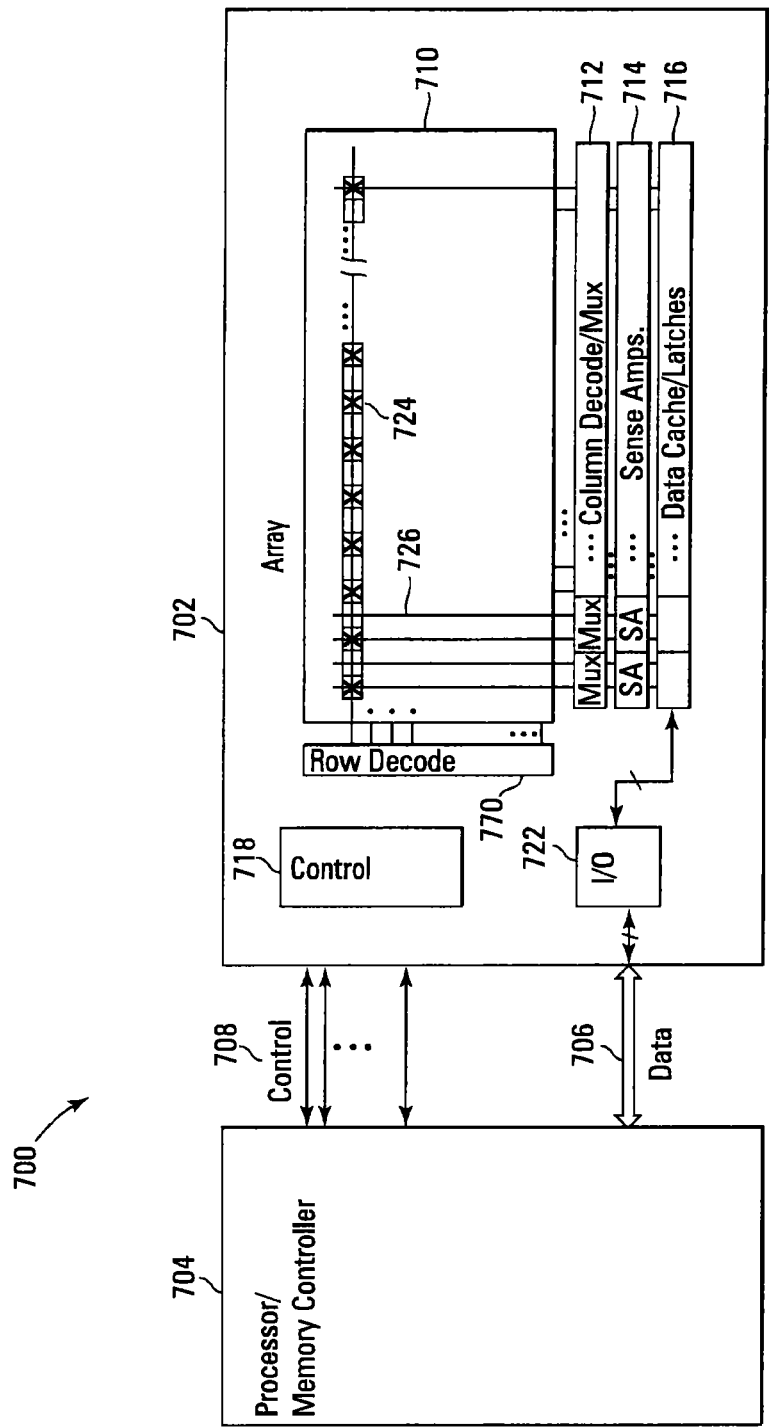
FIG. 7 is a block schematic of an electronic system and non-volatile memory device in accordance with an embodiment of the disclosure.

In FIG. 7, a simplified diagram of a system 700 is illustrated having a non-volatile memory device 702 of an embodiment of the present invention coupled to a host 704, such as a processor or memory controller. The non-volatile memory device 702 includes an array of memory cells 710 arranged in rows and columns. A row decode circuit 770 and a column decode circuit 712 are provided to decode address signals provided to the memory device 702 by the host 704. Address signals are received and decoded to access memory array 710. Memory device 702 also includes input/output (I/O) control circuitry 722 to manage input of commands, addresses and data to the memory device 702 as well as output of data and status information from the memory device 702. Control logic 718 controls access to the memory array 710 in response to commands and generates status information for the external host 704. The control logic 718 is coupled to row decode circuit 770 and column decode circuit 712 to control the row decode circuit 770 and column decode circuit 712 in response to the addresses. The control logic 718 is also coupled to a data cache 716, which latches data, either incoming or outgoing, and is coupled to the memory array 710 and the I/O control circuit 722. The individual latches of the data cache 716 are coupled to the read/write circuitry incorporating sense amplifiers 714 and the column decoder/multiplexer 712. The sense amplifiers also contain internal latches that are utilized to store data to programmed into a selected memory row 724 of the memory array 710, or to latch data sensed from a page of memory cells of a row 724 of the array 710 to then be compared against the program data stored in the data latch 716 in a verify operation or transferred to the data latch 716 to be read from the memory 702 in a read operation. The sense amplifiers are multiplexed to two or more data lines, such as bit lines, 726 of the memory array 710 through the column decoder 712, which selects a physical page of memory cells from the selected row 724.

Figure 8A:
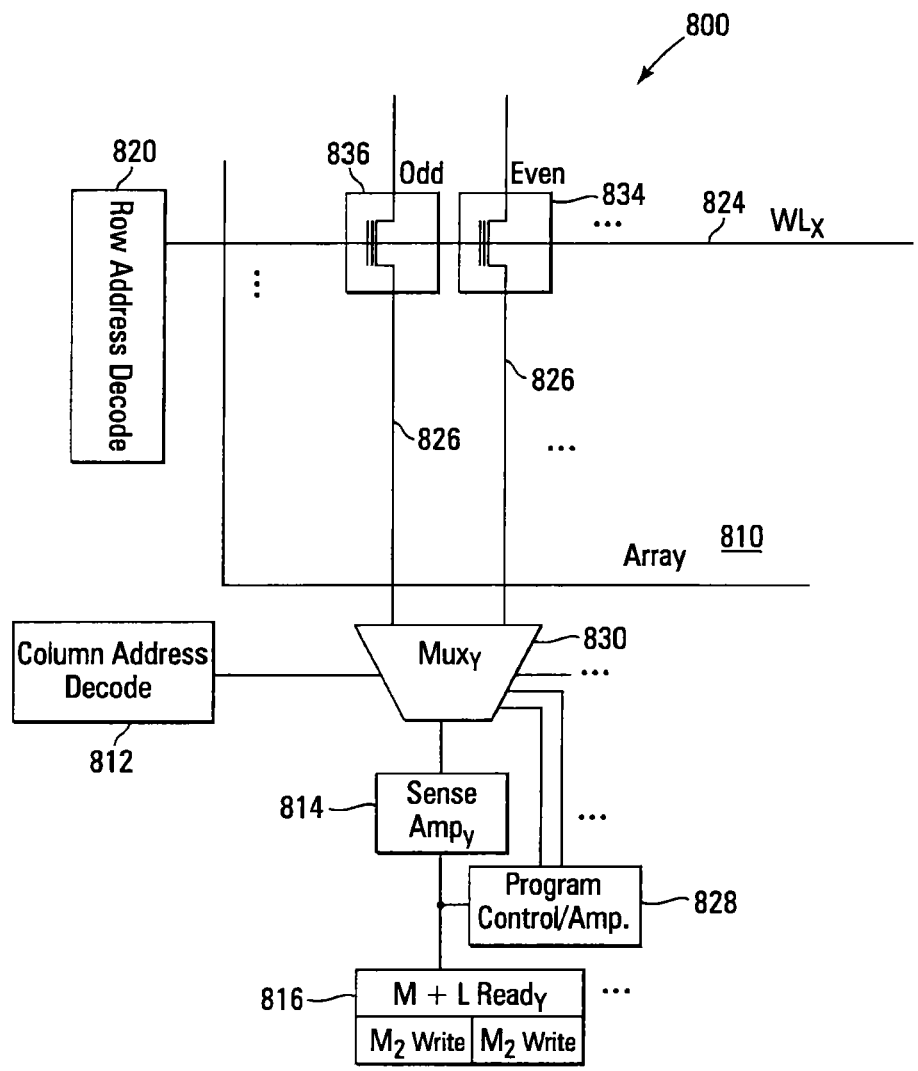
FIGS. 8A and 8B are schematics of column multiplexing and latches of a non-volatile memory array in accordance with one or more embodiments of the disclosure.
Figure 8B:
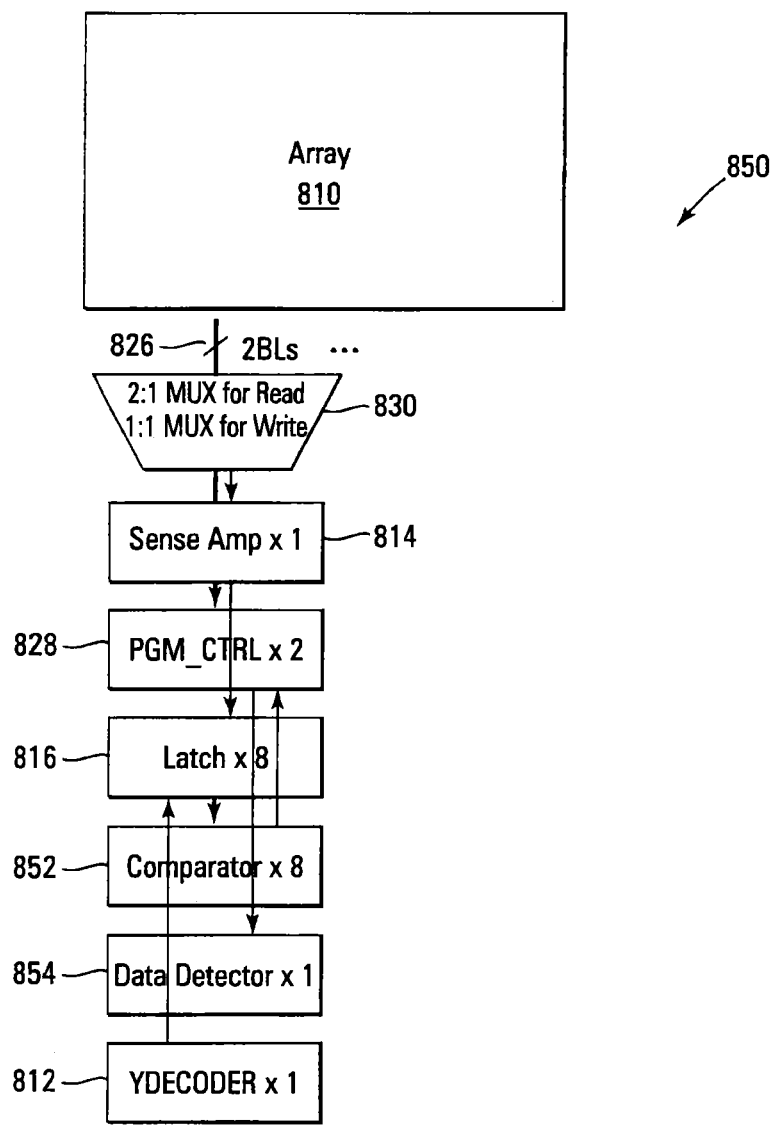

FIGS. 8A and 8B detail various exemplary read/write circuits 800, 850 of embodiments of the present invention. In FIG. 8A, read/write circuit 800 is coupled to two bit lines 826 of the array 810, wherein each row 824 comprises two memory cell pages (the odd page 836 and the even page 834). In the read/write circuit 800, a sense amplifier 814 is coupled to sense amplifier data latches 816 and column multiplexer 830, which is coupled to the column address decoder 812. The sense amplifier data latches 816 are also coupled to the program control/amplifier 828 for programming operations. In operation, a word line coupled to a row 824 of the memory array 810 is selected by the row address decoder 820 activating the memory cells 834, 836 of the row 824 coupled to the bit lines 826. The bit lines 826 are then coupled by the column multiplexer 830 to either the sense amplifier 814 or the program control 828, depending on the mode of operation to be accomplished (row program or page sensing). When programming data into the selected row 824 of the memory array 810, the data latches 816 are configured (by internal multiplexers, not shown) to store M-bits (or alternatively, M+N bits in an increased program resolution embodiment) of data for each cell of the array coupled to the coupled bit lines 826 of the read/write circuit 800. The data latches are then coupled through the program control circuit 828 to the column multiplexer 830, which is configured in 1:1 mode to program all the coupled memory cells 834, 836 of the row 824 in a single programming cycle. While sensing data a Vt level of a selected physical memory cell page 834, 836 of the array 810, a bit line 826 of a memory cell of either the even 834 or the odd 836 page is selected by the column multiplexer 830 and coupled to the sense amplifier 814 to sense the Vt of the cell 834, 836. The Vt of the cell 834, 836 is assigned to a bit encoding of the logic window (M-bits) and increased read resolution (L-bits) and stored in the coupled sense amplifier latches 816, which have been multiplexed from storing M-bits per bit line/cell for a row program cycle to storing M+L bits per cell of the selected row page (even page 834 or odd page 836).

In FIG. 8B, another read/write circuit 850 embodiment of the present invention is coupled to two bit lines 826 of the array 810, wherein each row 824 comprises two physical memory cell pages (the odd page 836 and the even page 834), each MLC cell storing 4 bits each. In the read/write circuit 850, the sense amplifier 814 is coupled to the column multiplexer 830 and the sense amplifier data latches 816. The column address decoder 812 are coupled to the sense amplifier data latches 816 to select the desired column during either program or sense. The sense amplifier data latches 816 are also coupled to the program control/amplifier 828, comparator 852 and data detector 854 for programming operations. When programming data into a selected row of the memory array 810, the data latches 816 are configured (by internal multiplexers, not shown) to store M=4 bits of data for each cell of the two coupled bit lines 826 of the read/write circuit 850. The data latches are then coupled through the program control circuit 828 to the column multiplexer 830, which is configured in 1:1 mode to program all the coupled memory cells of the row in a single programming cycle. While sensing data a Vt level of a selected memory cell page of the array 810, a bit line 826 of a memory cell of the even or the odd page is selected by the column multiplexer 830 and coupled to the sense amplifier 814 to sense the Vt of the cell. The Vt of the cell 834, 836 is assigned to a bit encoding of the logic window (M=4 bits) and increased read resolution (L=4 bits) and stored in the coupled sense amplifier latches 816, which have been multiplexed from storing 4-bits per bit line/cell for a row program cycle to storing M+L=4+4=8 bits per cell of the selected row page (even page or odd page).

Figure 9:
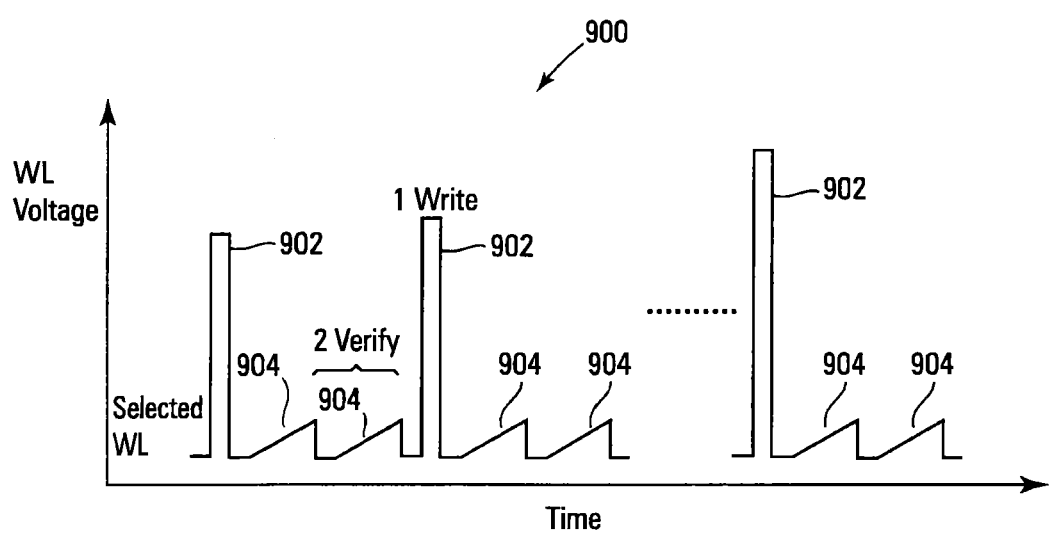
FIG. 9 is a diagram of a row programming cycle and subsequent page verify reads in a non-volatile memory device in accordance with an embodiment of the disclosure.

FIG. 9, details a word line voltage waveform of a single row program operation 902 followed by separate sensing operations 904 utilizing ramping word line voltages to determine the programmed Vt of the cells of the selected page for the two page row (odd and even pages). It is noted that the ramping word line voltage sensing 904 of FIG. 9 is for illustrative purposes only and that other sensing operations are possible, including, but not limited to direct analog to digital conversion (ADC), selected voltages on the word lines applied in a stepped manner to determine the programmed logic window, and source-follower sensing.

Figure 10:
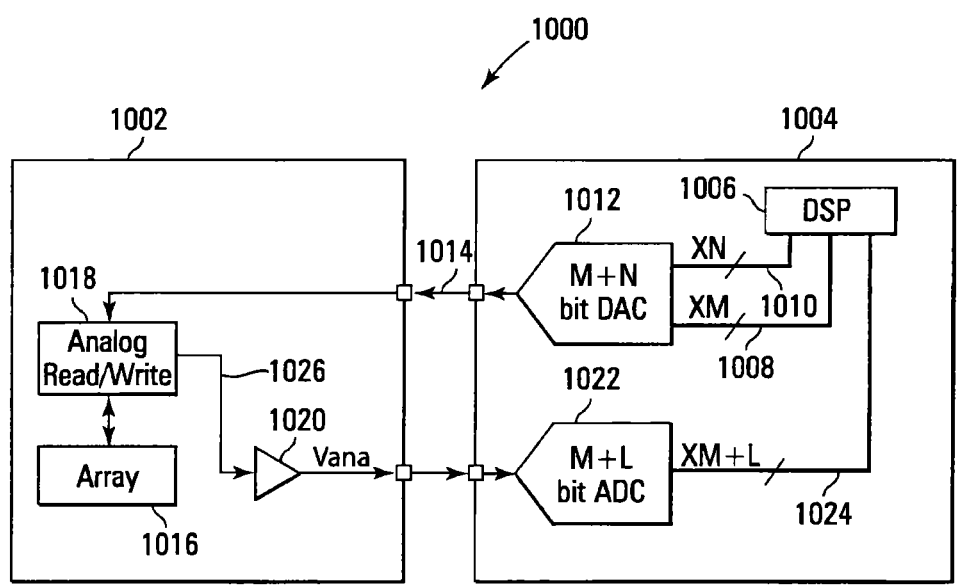
FIG. 10 is a block schematic of an electronic system in accordance with an embodiment of the disclosure utilizing analog data communication.

FIG. 10 details a simplified diagram of system 1000 having an analog NAND architecture non-volatile memory device 1002 of an embodiment of the present invention coupled to a memory controller 1004. In FIG. 10, the data to be written to the non-volatile memory device 1002 is processed by an internal digital signal processor (DSP) 1006 of the controller 1004, which outputs M bits of digital data 1008 in combination with the N bits 1010 of additional programming resolution for each selected memory cell to be written in the non-volatile memory device 1002. This M+N bits 1008, 1010 of program data for each selected memory cell is then converted by a M+N bit digital to analog converter (DAC) 1012 and output to the non-volatile memory device 1002 as an analog data signal 1014. Internal to the non-volatile memory device 1002, the M+N bit analog data signal 1014 is used to program a selected cell of the NAND architecture memory array 1016 by the read/write circuitry 1018 in a program operation.

Upon access one or more selected memory cells from the non-volatile memory device array 1016 are sensed by the read/write circuitry 1018. The sensed data 1026 is then buffered 1020 and transferred from the non-volatile memory device 1002 to the coupled memory controller 1004 as an analog signal. Within the memory controller 1004, the analog data value signal is converted from analog to digital values with an analog to digital converter 1022 and outputs at the elevated M+L bits of read resolution 1024. This M+L bits of sensed threshold voltage read resolution for each cell is then coupled to the DSP 1006 for processing and retrieval of the stored M bits of data from each memory cell.

It is noted that the analog signal bus 1014 transferring the analog data signal from the controller 1004 to the memory device 1002 can have multiple possible forms, including, but not limited to parallel signal buses, serial signal buses, bi-directional signal buses, and unidirectional transmit and receive signal buses.

As detailed above in FIG. 10, various embodiments of the present invention include memory devices adapted to process and generate analog data signals representative of data values of the M+N programmed data values to store M bits of data in each cell. This is facilitated by storing data values as threshold voltage ranges on a non-volatile memory cell. Unlike the bit-by-bit programming operations of traditional multi-level cell technology, the various embodiments may program directly to a target threshold voltage for the desired bit pattern or data. Similarly, instead of reading individual bits, the various embodiments generate a data signal indicative of the threshold voltage of the target memory cell, and thus indicative of the M+L bits read from each cell, where M bits of data are stored in each cell.

It is noted that while various embodiments may receive and transmit the data signals as analog signals representative of bit patterns of two or more bits, they may also provide conversion internal to the memory device to an analog signal or selected threshold voltage range/state to permit receiving and transmitting digital signals representative of individual bits. It is also noted that in utilizing analog data signals, because a single analog data signal could represent two, four or more bits of information, data transfer rates may be increased along with memory density as each program or read operation is concurrently processing multiple bits per memory cell.

Figure 11:
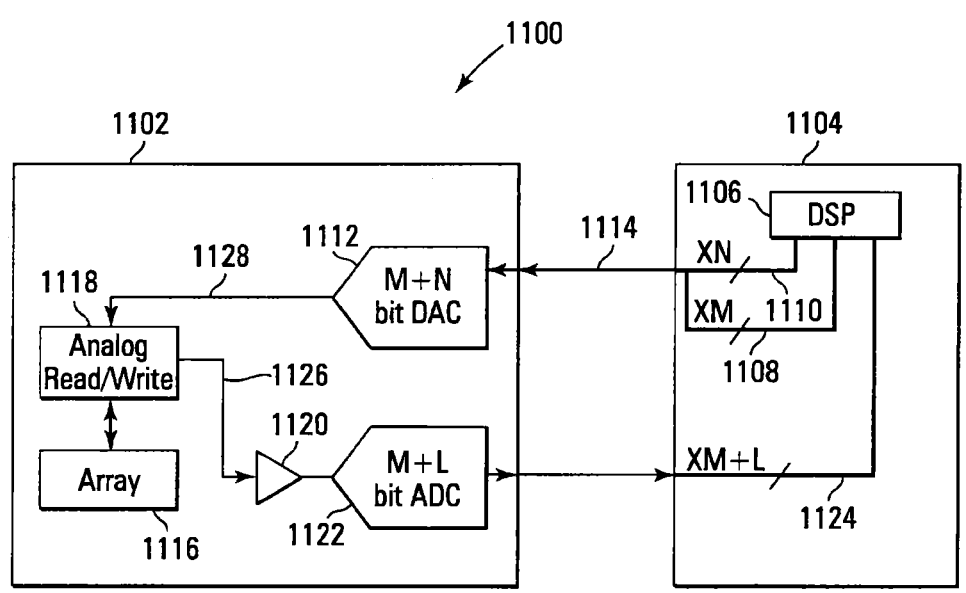
FIGS. 11 and 12 are block schematics of electronic systems in accordance with embodiments of the disclosure utilizing digital data communication.
Figure 12:
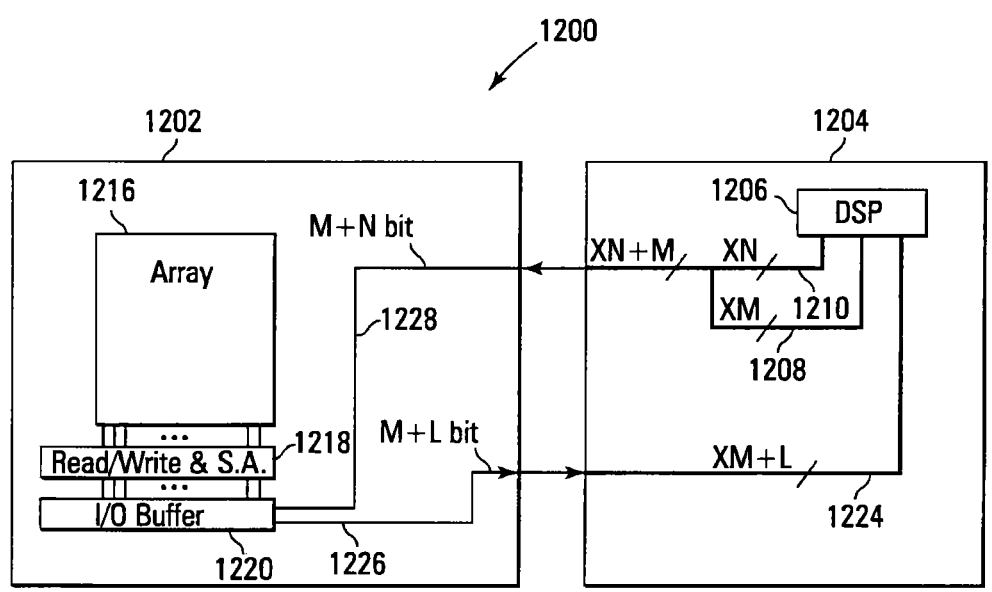

As detailed in FIGS. 11 and 12, other embodiments of the present invention also include memory devices adapted to receive and process digital data signals representative of the M+N programmed data values to store M bits of information in each cell. These digital data signals can then be utilized internal to the memory device to program threshold voltages in selected memory cells by either conversion to a threshold voltage representation or through direct selection of memory cell state defined by a threshold voltage range. In addition, in various embodiments of the present invention, the memory devices are adapted to generate and transmit digital data signals representative of the M+L bits read from each cell, where M bits of data are stored in each cell.

In FIG. 11, a simplified diagram of system 1100 having a NAND architecture non-volatile memory device 1102 of an embodiment of the present invention coupled to a memory controller 1104 utilizing digital communication and internal analog conversion of the digital data. The data to be written to the non-volatile memory device 1102 is processed by an internal digital signal processor (DSP) 1106 of the controller 1104, which outputs M bits of data 1108 in combination with the N bits 1110 of additional programming resolution for each selected memory cell to be written in the non-volatile memory device 1102. This M+N bits 1108, 1110 of program data for each memory cell selected to be programmed is then transferred 1114 as a digital representation to the memory device 1102 and converted by a M+N bit digital to analog converter (DAC) 1112 to an analog data signal 1128 internally to the non-volatile memory device 1102. The M+N bit analog data signal 1128 is used to program one or more selected cells of the memory array 1116 by the read/write circuitry 1118 in a program operation.

Upon access one or more selected memory cells of the non-volatile memory device array 1116 are sensed by the read/write circuitry 1118. The sensed threshold voltage(s) 1126 are then buffered 1120, if required, and converted from analog to digital signals with an analog to digital converter 1122 of the non-volatile memory device 1102 at the elevated M+L bits of read resolution. This M+L bits 1124 of sensed threshold voltage read resolution for each cell is then transferred from the non-volatile memory device 1102 to the coupled memory controller 1104 and coupled to the DSP 1106 for processing and retrieval of the M bits of data stored in each memory cell.

In FIG. 12, a simplified diagram of system 1200 having a non-volatile memory device 1202 of an embodiment of the present invention coupled to a memory controller 1204 utilizing digital communication. The data to be written to the non-volatile memory device 1202 is processed by an internal digital signal processor (DSP) 1206 of the controller 1204, which outputs M bits of data 1208 in combination with the N bits 1210 of additional programming resolution for each selected memory cell to be written in the non-volatile memory device 1202. This M+N bits 1208, 1210 of program data for each memory cell selected to be programmed is then transferred across a bus 1214 as a digital representation to the memory device 1202. Internal to the memory device 1202 the M+N bits 1208, 1210 of program data is programmed by the sense amplifier and read/write circuitry 1218 in a program operation into the selected non-volatile memory cells of the memory array 1216 utilizing a threshold logic window state and programming threshold voltage level directly selected by the input M+N bit digital data.

Upon access one or more selected memory cells from the non-volatile memory device array 1216 are sensed by the read/write circuitry 1218 and the sensed threshold voltage matched to a digital representation of the elevated read resolution. This sensing and matching of the threshold voltage to a digital representation can be accomplished by one of any of the above detailed methods, including, but not limited to, traditional multi-pass reading, ramped word line voltage reading, or source-follower reading. This digital representation of the sensed threshold voltage is then buffered in the I/O Buffer 1220 and output 1226 at the elevated M+L bits of read resolution from the non-volatile memory device 1202. After transfer from the non-volatile memory device 1202 to the coupled memory controller 1204, this M+L bits 1224 of sensed threshold voltage read resolution for each cell is coupled to the DSP 1206 for processing and retrieval of the M bits of data stored in each memory cell.

It is noted that the digital bus 1114, 1214 transferring the digital data from the controller 1104, 1204 to the memory device 1102, 1202 of FIGS. 11 and 12 can have multiple possible forms, including, but not limited to parallel data buses, serial data buses, bi-directional data buses, and unidirectional data buses.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

CONCLUSION

A memory device and programming and/or reading process has been described that programs a row of non-volatile multi-level memory cells (MLC) in a single operation to minimize program disturb, while verifying each memory cell page of the row separately. In one embodiment of the present invention, the memory device utilizes data latches to program M-bits of data into each cell of the row and then repurposes the data latches during the subsequent page verify operations to read M+L bits from each cell of the selected page at a higher threshold voltage resolution than required. In sensing memory cells, the increased threshold voltage resolution/granularity allows more accurate interpretations of the actual programmed state of the memory cell and also enables more effective use of data encoding and decoding techniques such as convolutional codes where additional granularity of information is used to make soft decisions reducing the overall error rate of the memory. The architecture enables other decoding techniques such as PRML, Trellis Code Modulation and other advanced codes such as LDPC and Turbo codes which utilize probabilistic decoding techniques to achieve optimal decoding, thereby potentially reducing the overall error rate of the memory.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory controller, comprising:
a digital signal processor;
an M+N bit digital to analog converter coupled to receive M bits of digital data in combination with the N bits of additional programming resolution from the digital signal processor, the digital to analog converter configured to output a plurality of analog signals;
an M+L bit analog to digital converter coupled to receive an analog signal and coupled to output an M+L bit digital signal to the digital signal processor; and
wherein N is not equal to L;
wherein the plurality of analog signals output by the digital to analog converter are used to program a plurality of memory cells commonly coupled to a selected access line of a memory device substantially simultaneously with M+N bits; and wherein the analog signal received by the analog to digital converter comprises M+L bits is sensed separately from one of the plurality of memory cells coupled to the selected access line of the memory device.

2. The memory controller of claim 1, wherein the digital signal processor is configured to retrieve M bits of data from the M+L bit digital signal.

3. The memory controller of claim 1, wherein the M+L bit analog to digital converter is configured to receive the analog signal from the one of the plurality of memory cells coupled to the selected access line of the memory device through an output buffer of the memory device.

4. The memory controller of claim 1, wherein the M+N bit digital to analog converter is configured to transfer the plurality of analog signals to read/write circuitry of the memory device.

5. The memory controller of claim 1, wherein the M+N bit digital to analog converter is configured to transfer the plurality of analog signals to the memory device across a bus selected from the group consisting of a parallel signal bus, a serial signal bus, a bi-directional signal bus, and a unidirectional signal bus.

6. A memory controller, comprising:
a digital signal processor;
wherein the digital signal processor is configured to output a plurality of digital data signal used to substantially simultaneously program a plurality of memory cells commonly coupled to a selected access line of a memory device with M+N bits of program data;
wherein the digital signal processor is configured to receive a digital data signal of M+L bits read separately from one of the plurality of memory cells coupled to the selected access line of the memory device and to retrieve from the received digital data signal M bits of data that were stored in the one of the plurality of memory cells coupled to the selected access line of the memory device; and
wherein N is not equal to L.

7. The memory controller of claim 6, wherein the memory controller further comprises:
a digital to analog converter coupled to receive the plurality of digital data signals and to convert the plurality of digital data signals to a plurality of analog data signals for output to the memory device.

8. The memory controller of claim 6, wherein the memory controller further comprises:
an analog to digital converter coupled to receive an input analog data signal from the memory device and to convert the input analog data signal to the digital data signal of M+L bits.

9. The memory controller of claim 6, wherein the digital signal processor is configured to output the plurality of digital data signals to the memory device.

10. The memory controller of claim 9, wherein the digital signal processor is configured to output the of digital data signals across a digital bus between the memory controller and the memory device, wherein the digital bus is selected from the group consisting of a parallel data bus, a serial data bus, a bi-directional data bus, and a unidirectional data bus.

11. The memory controller of claim 9, wherein the digital signal processor is configured to output the plurality of digital data signals to an I/O buffer of the memory device.

12. The memory controller of claim 11, wherein the digital signal processor is configured to receive the digital data signal of M+L bits from the I/O buffer of the memory device.

13. The memory controller of claim 6, wherein the digital signal processor is configured to output the plurality of digital data signals to a digital to analog converter of the memory device.

14. The memory controller of claim 6, wherein the digital signal processor is configured to receive the digital data signal of M+L bits from an analog to digital converter of the memory device.

15. A memory controller, comprising:
a digital signal processor, wherein the digital signal processor is configured to output a plurality of digital data signals, and wherein the digital signal processor is configured to receive a digital data signal of M+L bits of data, and wherein the digital signal processor is configured to retrieve from the received digital data signal M bits of data;
an M+N bit digital to analog converter coupled to receive the plurality of digital data signals from the digital signal processor, and configured to output plurality of analog signals to a memory device; and
an M+L bit analog to digital converter coupled to receive an analog signal from the memory device, and configured to output the digital data signal of M+L bits of data to the digital signal processor;
wherein N is not equal to L;
wherein the plurality of analog signals output by the digital to analog converter are used to program a plurality of memory cells commonly coupled to a selected access line of the memory device substantially simultaneously with M+N bits of data; and
wherein the M+L bits of data are sensed separately from one of the plurality of memory cells coupled to the selected access line of the memory device.

16. The memory controller of claim 15, wherein the M+N bit digital to analog converter is configured to output the plurality of analog signals to the memory device across a bus selected from the group consisting of a parallel signal bus, a serial signal bus, a bi-directional signal bus, and a unidirectional signal bus.

* * * * *

UNITED STATES PATENT AND TRADEMARK OFFICE
CERTIFICATE OF CORRECTION

| | | |
|---|---|---|
| PATENT NO. | : 8,737,127 B2 | Page 1 of 1 |
| APPLICATION NO. | : 13/770059 | |
| DATED | : May 27, 2014 | |
| INVENTOR(S) | : Vishal Sarin et al. | |

It is certified that error appears in the above-identified patent and that said Letters Patent is hereby corrected as shown below:

In the Claims:

In column 23, line 30, in Claim 6, delete "signal" and insert -- signals --, therefor.

In column 24, line 5, in Claim 10, delete "the of" and insert -- the plurality of --, therefor.

In column 24, line 33, in Claim 15, before "plurality" insert -- a --.

Signed and Sealed this
Twelfth Day of August, 2014

Michelle K. Lee
*Deputy Director of the United States Patent and Trademark Office*